United States Patent
Kerns

[11] 4,027,239
[45] May 31, 1977

[54] CURRENT LEVEL DETECTOR

[75] Inventor: Cordon R. Kerns, Wheaton, Ill.

[73] Assignee: The United States of America as represented by the United States Energy Research and Development Administration, Washington, D.C.

[22] Filed: Nov. 25, 1975

[21] Appl. No.: 635,016

[52] U.S. Cl. .................... 324/118; 332/43 B
[51] Int. Cl.² ............... G01R 19/18; H03C 1/54
[58] Field of Search .......... 324/118; 330/10; 332/43, 44; 329/164

[56] References Cited
UNITED STATES PATENTS

| | | |
|---|---|---|
| 2,304,135 | 12/1942 | Wise .................... 332/43 B |
| 2,724,742 | 11/1955 | Chesnut .................... 332/43 B |
| 2,854,633 | 9/1958 | Jager .................... 324/118 |
| 3,434,075 | 3/1969 | Hawkins .................... 332/43 B |

Primary Examiner—Rudolph V. Rolinec
Assistant Examiner—Ernest F. Karlsen
Attorney, Agent, or Firm—Dean E. Carlson; Arthur A. Churm; Paul A. Gottlieb

[57] ABSTRACT

A device is provided for detecting the current level of a DC signal. It includes an even harmonic modulator to which a reference AC signal is applied. The unknown DC signal acts on the reference AC signal so that the output of the modulator includes an even harmonic whose amplitude is proportional to the unknown DC current.

7 Claims, 3 Drawing Figures

CURRENT LEVEL DETECTOR

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

Protection circuits for loads powered from high voltage power supplies are desirable particularly in the field of high energy physics instrumentation. Such devices are normally built within the power supply itself. However, an additive system remotely monitoring, measuring and crowbaring high voltage power supplies with variable preset threshold levels is desirable. For example, proportional wire chambers may require self-destruct protection from high current discharge in certain high energy physics applications.

It is therefore an object of this invention to provide overcurrent protection for high voltage power supplies.

Another object of this invention is to provide a remote element for monitoring current levels of a DC signal.

SUMMARY OF THE INVENTION

There is provided a device for detecting the current level of a DC signal from a power source and for providing overcurrent protection for the power source. It includes a pair of front-to-back coupled diode pairs to which a reference AC signal is applied by a balanced push pull type input circuit. The reference AC signal is offset by the unknown DC current. The combination of diodes acts as an even harmonic modulator so that the output thereof is the even harmonics of the reference AC signal. The amplitude of these even harmonics will be proportional to the current level of the unknown DC signal. Means are provided for demodulating one particular harmonic of the series of even harmonic outputs of the modulator and for utilizing the information thus obtained about the current level of the unknown DC signal to provide overcurrent protection for the power supply.

DETAILED DESCRIPTION OF THE PREFERRED EMBODIMENT

Figure 1:
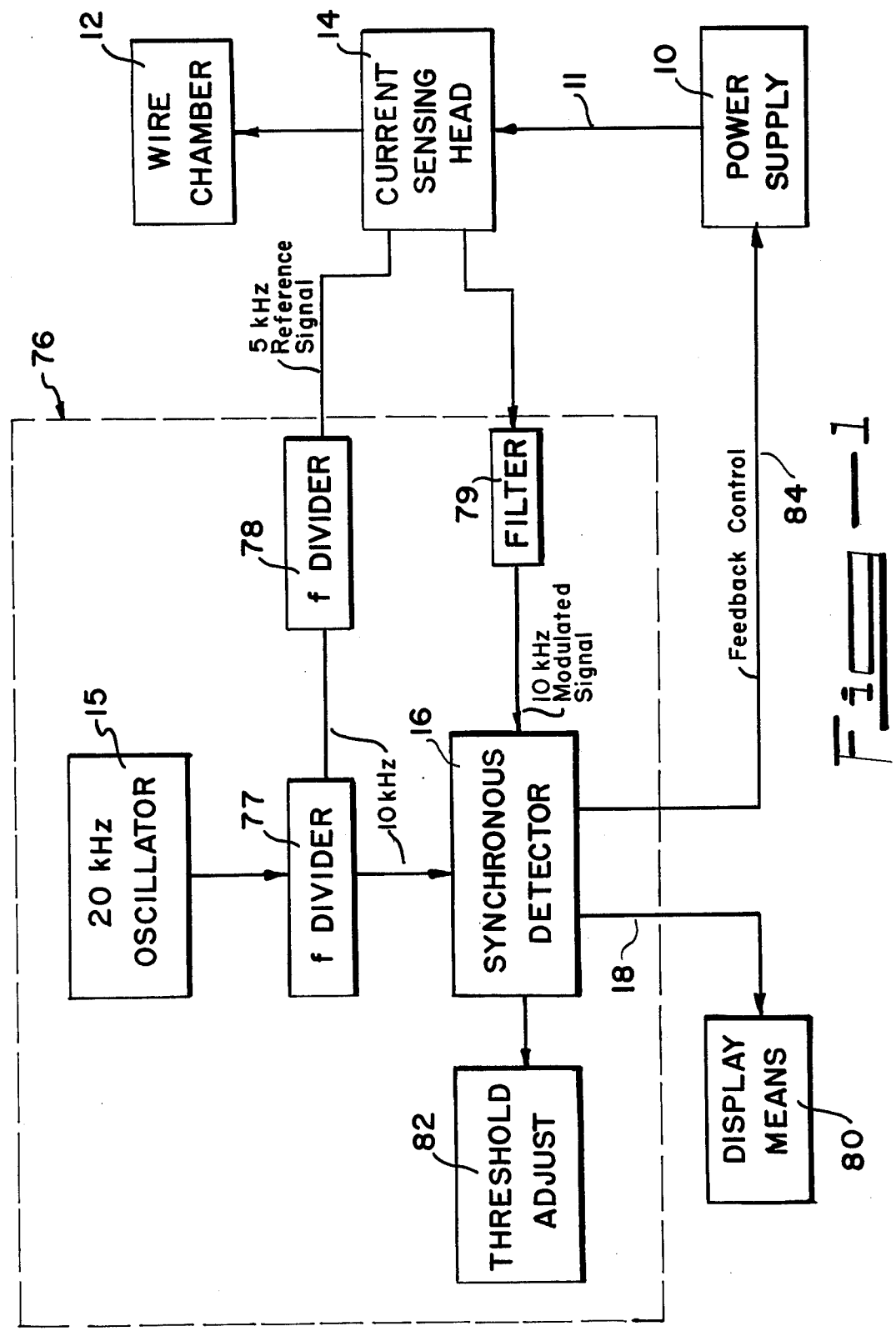
FIG. 1 is a block diagram of the overcurrent detection system.

Referring to FIG. 1 there is shown a block diagram of a device for sensing the current level of a DC signal. It should be understood that the term DC includes a direct current, or a current which may vary, and even vary by changing direction. For example, such a signal might be a high voltage signal developed by power supply 10, which is to be applied via lead 11 and to a load 12, such as a proportional wire chamber as might be used to detect the presence of high energy subatomic particles. The disclosed circuit provides a means for detecting the current level of the high voltage signal developed by power supply 10 and for providing overcurrent protection for power supply 10 and load 12. The circuit includes a current sensing head 14 which modulates a reference AC signal developed by oscillator 15 according to the current level of the unknown signal developed by power supply 10. The modulated AC signal from sensing head 14 is applied to synchronous detector 16 where the AC signal is demodulated giving a DC output signal at 18 whose amplitude is proportional to the current level of the unknown signal developed by power supply 10 at lead 11.

Figure 2:
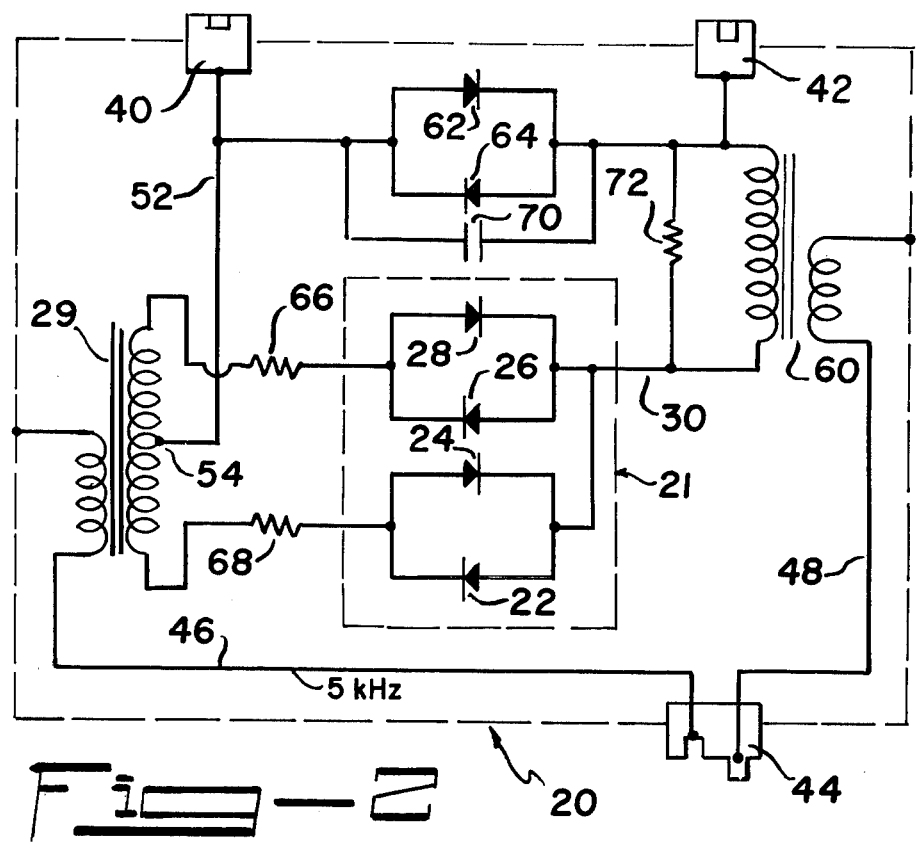
FIG. 2 is a schematic of the current sensing head of the detection system.
Figure 3:
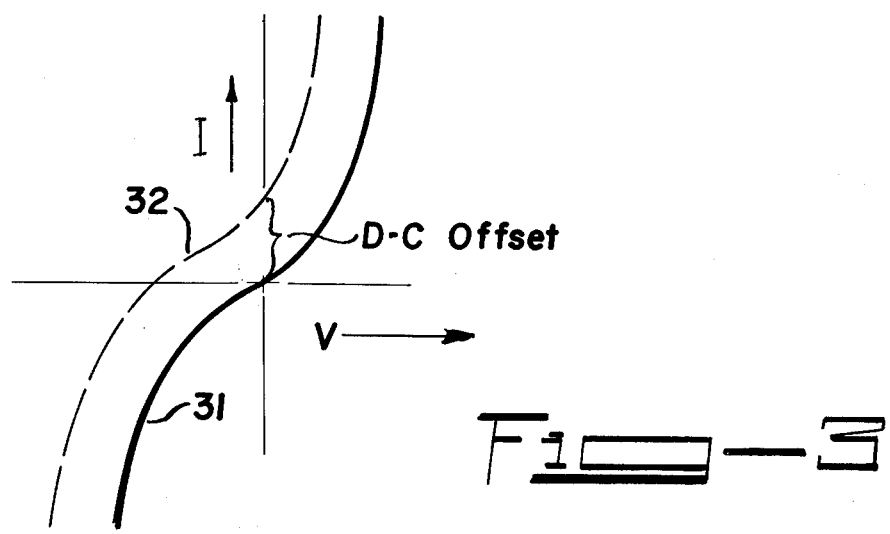
FIG. 3 is a graph of the response characteristic of a front-to-back coupled diode pair.

Referring to FIG. 2, there is shown a schematic of current sensing head 14 of FIG. 1. Sensing head 14 is designed to develop an output signal which is the even harmonics of a reference AC signal modulated according to the amplitude of an unknown DC signal. The head 14 may be contained within a single enclosure 20 and thereby remotely used. Head 14 includes an even harmonic modulator 21 comprised of two pairs 22 and 24, and 26 and 28 of front-to-back coupled diodes connected from transformer 29 to output lead 30. To understand the operation of modulator 21, consider the I-V characteristic of one pair of front-to-back couple diodes, such as pair 22 and 24, as shown in FIG. 3. The device is no longer a rectifier as with a single diode, but rather has an output curve 31 symmetrical in the first and third quadrants. Due to this symmetry, an AC carrier signal, applied with no DC offset to such a diode pair, produces only odd harmonic currents in an output load. However, a combination of an AC carrier signal plus a DC offset produces an output such as curve 32 having even harmonics as well as odd harmonics. If the offset is positive the even harmonics of the output will be in the second quadrant, while if negative they will be in the fourth quadrant. The amplitude of the even harmonics will be proportional to the amplitude of the DC offset. It is therefore necessary to eliminate the odd harmonics. By applying a balanced push-pull type AC input modulated signal, offset by the unknown DC to a pair of front-to-back coupled diodes, as shown in FIG. 2, odd hrmonics are cancelled out of the output at lead 30 of the even harmonic modulator 21. Thus, only even harmonics are passed by modulator 21. Since, of the even harmonics so produced, the second is the strongest, additional circuitry is provided to utilize only the second harmonic, although any other even harmonic could be utilized, or even the complete series of even harmonics.

In the embodiment shown in FIG. 2, the modulator 21 is contained within the remote sensing head as part of a single unit which may be positioned in series with the DC signal to be monitored and remote from the other instrumentation. To that end, the sensing head is provided with connectors 40 and 42 which are plugged in series between power supply 10 and chamber 12 as shown in FIG. 1. Connector 44 couples the reference AC signal, the output of oscillator 15, to the current sensing head via lead 46 and also returns the modulated second harmonic signal of the current sensing head to synchronous detector 16 via lead 48. The reference AC signal which for illustrative purposes might be 5 Khz, is coupled from DC ground to the unknown DC potential by transformer 29. The purpose of transformer 29 is to provide a balanced push-pull type input to the two diode pairs so that the addition of the output of each of the diode pairs will result in the cancellation of odd harmonics. Of course, any other means of applying such a balanced input may be used, such as by solid state devices, however, a transformer is preferred since it is a passive element. The unknown signal is applied via lead 52 to the center tap 54 of the secondary of transformer 29. The symmetry of transformer 29's center tap winding and the coupling of the output of transformer 29 in series with the diode pairs 22 and 24, and 26 and 28 results in cancelling of odd harmonics at the output 30 of modulator 21. This also results in the output at 30 being the even harmonics of the input reference AC signal offset according to the current level of the unknown DC signal. The direction or polarity of the unknown signal will be indicated by the phase of the even harmonics, i.e. whether they are in the second or fourth quadrant of FIG. 3.

Transformer 60 serving as an output means couples the even harmonics of the output at 30 back to ground from the unknown potential. Modulator 21 is shunted by a pair of front-to-back coupled diodes 62 and 64. These diodes are of such characteristic that they provide a low impedance shunt path to protect the diodes of modultor 21 when the current being monitored is beyond the capactiy of the diodes of modulator 21. For example, if diodes 22, 24, 26 and 28 are all IN914A diodes, diodes 62 and 64 might be IN4723. In addition, resistors 66 and 68, which might be, for example, 22 ohms, limit peak current applied to the diodes of modulator 21 during an overcurrent fault.

Transformer 29 couples the carrier reference signal from DC ground potential to the unknown high voltage potential. Transformer 60 couples the even harmonic signal from diode modulator 21 back to ground from the unknown high voltage potential. If one traces the DC path between the high voltage connectors 40 and 42, it can be seen that the current being monitored does not tend to saturate the core of transformer 29, owing to the circuit symmetry, but by contrast, the core of transformer 60 could be saturated. Therefore, the choice of core for transformer 29 is different from that of transformer 60. For example, the core of transformer 29 might be a molypermalloy tape-wound core which gives a high impedance per unit volume, whereas for transformer 60 one might use a manganese-zinc, ferrite core, less readily saturated. The relative DC current through the diode pairs of modulator 21 and of the bypass diode pairs 62 and 64 is such that the transformer 60 does not saturate at any measured current below approximately 20 amperes. This is an important feature in that it helps assure that protection remains present even under severe overload conditions. Within the normal zero to full scale range of current levels, the bypass diode pair is in a high impedance state. A capacitor 70 is provided in parallel to the bypassed diode pairs of 62 and 64 in order to provide a low impedance path for the second harmonic signal to transformer 60 in this operating range. Capacitor 70 also insures that negligible carrier or second harmonic frequency signals are injected into the high frequency line itself. This insures that there will be no false triggering of sensitive amplifier discriminators by unwanted second harmonic signals. Resistor 72 sets the scale factor of the modulator and can be changed according to the desired range of values. Representative values for the elements would be, for example, 1.8 kohms for resistor 72, 0.1 microfarad for capacitor 70, a primary of 15 turns and secondary of 30 turns for transformer 50, and a primary 300 turns and a secondary of 30 turns for transformer 60.

It may be that there will an inequality of the individual diode characteristics of each diode of modulator 21. Since diodes are not identical, an unwanted offset may be present. It has been found, however, that this unwanted offset from nonidentical diodes is well below a microampere equivalent in a 0 to 100 microampere range device. For a more demanding requirement of a lower offset, improved diodes could be used. For example, a monolithic, matched diode quad such as the Fairchild FSA 2702M, could be used. Such a quad is internally connected as a bridge rectifier, but this feature is acceptable as can be seen by tracing the original circuit shown in FIG. 2. Of course, such a quad cost quite a bit more than the diodes previously referred to.

Separated from sensing head 14 is the main instrumentation which may be contained in a separate control box 76 as shown in FIG. 1. Box 76 would include the oscillator 15, the synchronous detector 16 and other associated equipment. It is desirable that oscillator 15 produce a reference frequency which may be divided down to the carrier signal while at the same time providing a signal to which the second harmonic of the characteristic frequency may be compared to determine the actual offset caused by the unknown DC signal. For example, if the second harmonic is to be 10 Khz implying a carrier AC signal of 5 Khz, oscillator 15 might, for example, have an output of 20 Khz. Frequency divider 77 divides this frequency down to 10 Khz and divider 78 divides the 10 Khz to the 5 Khz level to give the carrier signal which is applied to the sensing head 14. The output of sensing head 14 will be the modulated even harmonics of 5 Khz. The output of head 14 is applied to filter 79 where the desired even harmonic is selected. Since the second is the most desirable even harmonic filter 79 is preferably tuned to 10 Khz for a reference signal of 5 Khz. Divider 77 divides the output of oscillator 15 down to the 10 Khz level. The synchronous detector, 16, is a device which compares AC signals of equal frequency and of equal period to determine their relative amplitudes. The additional division step from 20 Khz to 10 Khz, rather than using a single 10 Khz oscillator, is utilized in order to insure that the signals will have equal half periods. Dividers will guarantee this feature. The 10 Khz signal from divider 77 is utilized by detector 16 to determine the DC offset of the modulated signal from head 14. The synchronous detector 16 develops a DC output at 18 proportional to the actual level of the signal at 11. The polarity of the output at 18 will indicate the direction of the unknown current. The output at 18 can be displayed by display means 80. In addition, a threshold current can be set by threshold adjust 82 so that if it is reached by the unknown DC signal, a feedback can be sent via lead 84 to power supply 10 indicating that the power supply should shut down or reduce its current output.

The advantages of the disclosed diode modulator for current level repsonse is that it is a simple, low cost device which is rugged, being able to withstand continuous level load of ten times full scale, momentary overloads of 2 scale and microsecond spikes of 10 full scale with no ill effect; its output signal energy is large compared to the amplifier noise; its output is an AC signal; and its output is readily set in a frequency range where 1/F noise is insignificant. Stray magnetic field, shock and vibration have relatively little influence on the operation of the device. Since the offset DC either moves the characteristic into the second or fourth quadrant, the modulator correctly indicates the polarity of either sign of unknown current flow. Kickback noise into the circuit whose current is being measured is negligible.

The embodiments of the invention in which an exclusive property or privilege is claimed are defined as follows:

1. A device for detecting the current level of a DC signal, comprising:

reference signal means for developing an AC reference signal of particular frequency;

a balanced push-pull type input circuit coupled to said reference signal means and having said AC reference signal applied thereto, two front-to-back coupled diode pairs with said diode pairs coupled in series with each other and with said balanced input circuit, a first DC input connector coupled to said balanced input circuit, a second DC input connector, an output junction directly coupling the two diode pairs, output means coupled between the second DC input connector and the output junction, the DC current signal being applied as an offset so that with current level of the DC signal nonzero there is developed at the output junction an output signal composed of even harmonic frequencies of said particular frequency with the phase of said output determined by the polarity of said DC signal with the amplitude of said output proportional to the amplitude of said DC signal, and a demodulator coupled to said diode pairs responsive to said output signal to develop a monitor signal indicating the current level of the DC signal.

2. The device of claim 1 wherein said balanced input circuit includes a transformer having a center tap on the secondary winding thereof, said transformer having said AC reference signal applied to the primary winding thereof and having one end of the secondary winding thereof coupled to one diode pair and the other end of the secondary winding thereof coupled to the other diode pair, the first DC input connector being connected to said center tap.

3. The device of claim 2 wherein said demodulator includes means for selecting the second harmonic of said particular frequency, said demodulator being responsive to said second harmonic to develop said monitor signal.

4. The device of claim 3 wherein said demodulator includes a synchronous detector coupled to said reference signal means and being responsive to said second harmonic and said AC reference signal to develop said monitor signal being proportional to the amplitude of and of polarity determined by the direction of the DC signal.

5. The device of claim 4 further including a bypass comprised of a third pair of front-to-back coupled diodes coupled in parallel across the other diode pairs.

6. The device of claim 5 wherein said synchronous detector includes a threshold adjust for establishing a particular threshold value, said synchronous detector developing an alarm signal with said monitor signal in excess of said threshold value.

7. The device of claim 6 further including display means coupled to said synchronous detector and being responsive to said monitor to display the value thereof.

* * * * *